(12) United States Patent
Roethig

(10) Patent No.: US 7,454,719 B2
(45) Date of Patent: Nov. 18, 2008

(54) SYSTEM AND METHOD FOR CALCULATING EFFECTIVE CAPACITANCE FOR TIMING ANALYSIS

(75) Inventor: Wolfgang Roethig, San Jose, CA (US)

(73) Assignee: NEC Electronics America, Inc., Santa Clara, CA (US)

( * ) Notice: Subject to any disclaimer, the term of this patent is extended or adjusted under 35 U.S.C. 154(b) by 457 days.

(21) Appl. No.: 11/195,237

(22) Filed: Aug. 2, 2005

(65) Prior Publication Data

US 2005/0268262 A1    Dec. 1, 2005

Related U.S. Application Data

(62) Division of application No. 10/662,540, filed on Sep. 15, 2003, now Pat. No. 6,925,623.

(51) Int. Cl.
  *G06F 17/50* (2006.01)
(52) U.S. Cl. .................. 716/1; 716/4; 716/5; 716/6
(58) Field of Classification Search ............ 716/1–2, 716/4–6
  See application file for complete search history.

(56) References Cited

U.S. PATENT DOCUMENTS

| | | | | |
|---|---|---|---|---|
| 5,790,415 | A * | 8/1998 | Pullela et al. ................ | 716/6 |
| 6,314,546 | B1 * | 11/2001 | Muddu ........................ | 716/5 |
| 6,496,960 | B1 * | 12/2002 | Kashyap et al. .............. | 716/4 |
| 6,601,223 | B1 * | 7/2003 | Puri et al. .................... | 716/6 |
| 6,721,929 | B2 * | 4/2004 | Li et al. ...................... | 716/6 |

* cited by examiner

*Primary Examiner*—Paul Dinh
(74) *Attorney, Agent, or Firm*—Campbell Stephenson LLP

(57) ABSTRACT

A method involves: accessing data representing an interconnect model, where the interconnect model includes a driving point node and is not a lumped capacitance model; calculating a value of an effective capacitance of the interconnect model to be inversely proportional to a voltage at the driving point node of the interconnect model; and storing the value of the effective capacitance. Such a method can be used to calculate effective capacitance of the interconnect model using analytical techniques.

6 Claims, 7 Drawing Sheets

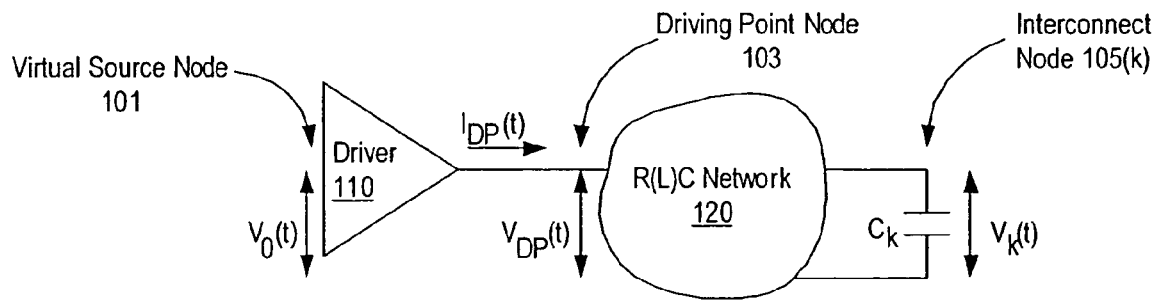
FIG. 1 - Prior Art
$$C_{eff} \cdot V(T) = \sum_{k=1}^{N} C_k \cdot V_k(T) \quad \text{Eq. 1}$$
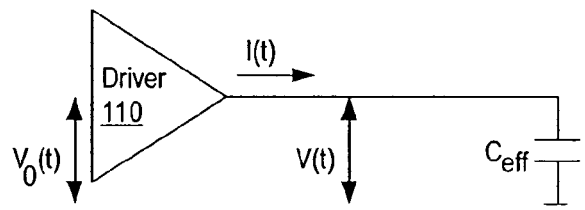
FIG. 2 - Prior Art
$$C_{eff} = \sum_{k=1}^{N} C_k \cdot \frac{V_k(T)}{V_{DP}(T)} \quad \text{Eq. 2}$$
FIG. 3

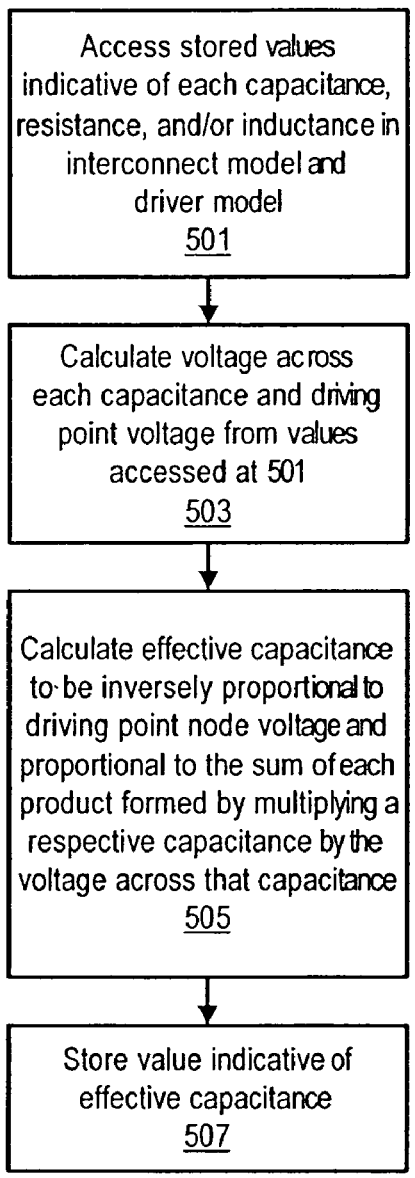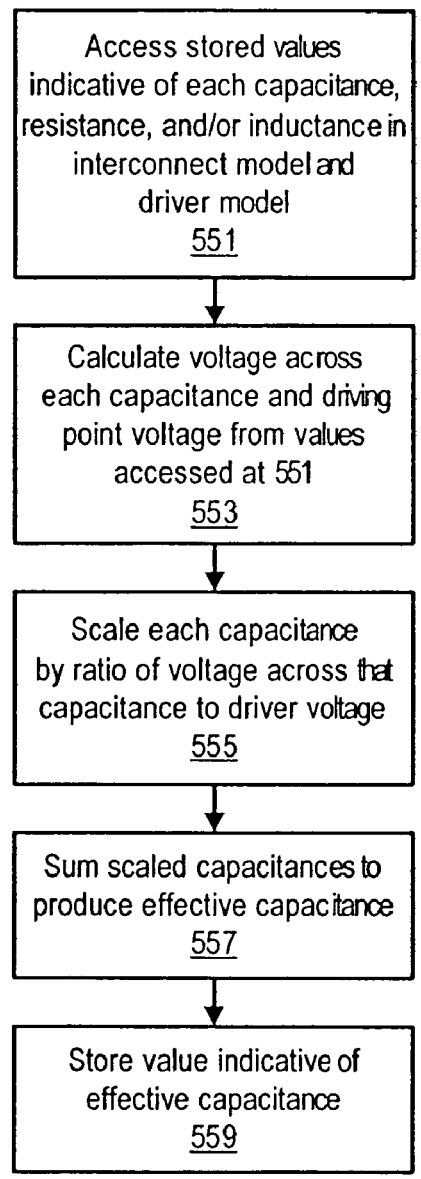
FIG. 5A
FIG. 5B

Eqs. 3  $T_{11} = R_{driver} \cdot C1 \qquad T_{12} = R_{driver} \cdot C2 \qquad T_{22} = R_{wire} \cdot C2$ Eqs. 4  $T_{Elmore} = T_{11} + T_{12} + T_{22} \qquad\qquad T_{Root} = \sqrt{T_{Elmore} - 4 \cdot T_{11} \cdot T_{22}}$ Eqs. 5  $s_{1,2} = \dfrac{\pm T_{Root} - T_{Elmore}}{2 \cdot T_{11} \cdot T_{22}}$ Eqs. 6  $\tau_1^1 = -\dfrac{1 + s_1 \cdot T_{22}}{T_{Root} \cdot S_1^2} \qquad\qquad \tau_2^1 = \dfrac{1 + s_2 \cdot T_{22}}{T_{Root} \cdot S_2^2}$ $\tau_1^2 = -\dfrac{1}{T_{Root} \cdot S_1^2} \qquad\qquad \tau_2^2 = \dfrac{1}{T_{Root} \cdot S_2^2}$ Eqs. 7  
$$V_1(t) = \begin{cases} 0 & t < 0 \\ \dfrac{1}{T} \cdot \left( t + \tau_1^1(1 - \exp(s_1 t)) + \tau_2^1(1 - \exp(s_2 t)) \right) & 0 \le t \le T \\ 1 + \dfrac{1}{T} \cdot \left( \tau_1^1(1 - \exp(s_1 T))\exp(s_1(t - T)) + \tau_2^1(1 - \exp(s_2 t))\exp(s_2(t - T)) \right) & T < t \end{cases}$$

$$V_2(t) = \begin{cases} 0 & t < 0 \\ \dfrac{1}{T} \cdot \left( t + \tau_1^2(1 - \exp(s_1 t)) + \tau_2^2(1 - \exp(s_2 t)) \right) & 0 \le t \le T \\ 1 + \dfrac{1}{T} \cdot \left( \tau_1^2(1 - \exp(s_1 T))\exp(s_1(t - T)) + \tau_2^2(1 - \exp(s_2 t))\exp(s_2(t - T)) \right) & T < t \end{cases}$$

Eq. 8  $C_{eff} = C1 + C2 \cdot \dfrac{V_2(T)}{V_1(T)}$

Eq. 9  $C_{eff} = C1 + C2 \cdot \dfrac{T + \tau_1^2(1 - \exp(s_1 T)) + \tau_2^2(1 - \exp(s_2 T))}{T + \tau_1^1(1 - \exp(s_1 T)) + \tau_2^1(1 - \exp(s_2 T))}$

FIG. 6

SYSTEM AND METHOD FOR CALCULATING EFFECTIVE CAPACITANCE FOR TIMING ANALYSIS

CROSS-REFERENCE TO RELATED APPLICATIONS

This application is a divisional of U.S. patent application Ser. No. 10/662,540, entitled "System and Method for Calculating Effective Capacitance for Timing Analysis," filed Sep. 15, 2003 now U.S. Pat. No. 6,925,623, and naming Wolfgang Roethig as inventor.

FIELD OF THE INVENTION

This invention relates to the field of IC (Integrated Circuit) design and, more particular, to techniques for calculating the effective capacitance of an interconnect in an IC design.

BACKGROUND OF THE INVENTION

During the integrated circuit (IC) design process, various components within an IC design are modeled and simulated so that the performance of those components can be verified against various design requirements before the IC is physically produced. If the modeled IC design does not perform as required, various parts of the IC design are modified, and the resulting IC design is again modeled and simulated. This process continues until a satisfactory IC design is obtained.

An interconnect model can also be used to model the cell timing (based on cell delay and interconnect delay) of a cell connected to an interconnect being modeled. There are many different interconnect models. One model, referred to as a pi model, is generated using moment-matching techniques based on information extracted from the physical layout of the IC design. The pi model can be obtained by moment-matching the first three moments of the driving point admittance of a more complex interconnect model extracted from the physical layout. The resulting pi model, which includes two capacitances connected by a resistance, can then be reduced to a lumped-capacitance model, which includes a single effective capacitance. Conversion from a pi model to a lumped-capacitance model typically involves using numeric methods. The lumped-capacitance model represents the driving point admittance of the interconnect model, which is in turn used to perform interconnect delay analysis.

In general, it is desirable that interconnect models represent the real-world performance of an interconnect as accurately as possible. More accurate interconnect models allow designers to more reliably detect design errors while also reducing the amount of overdesign (i.e., designing an IC more conservatively than is actually required, resulting in unneeded components or space or in decreased performance). However, the desire for more accurate interconnect models is balanced against the need to obtain an interconnect model within a reasonable amount of time. Generally, the more accurate the modeling technique, the more computationally intensive it is to obtain the model. Accordingly, less accurate models are often used in commercial applications because such models can be obtained significantly more quickly for complicated IC designs than more accurate models could be obtained. Since interconnect delay analysis is a necessary part of the IC design process, it is desirable to have techniques for obtaining the effective capacitance of an interconnect model that are both accurate and relatively simple to obtain.

Overview of Interconnect Models

FIG. 1 illustrates a generic interconnect model used to perform interconnect delay analysis in VDSM (Very Deep Sub-Micron) IC design processes. The model in FIG. 1 includes virtual source node 101 at which voltage $V_0(t)$ is applied as a stimulus to driver 110. Driver 110 represents a gate coupled to drive a signal on the interconnect represented by R(L)C network 120 (R(L)C refers to a network that includes one or more resistances R and one or more capacitances C, and that can, in some cases, include one or more optional inductances L).

The model includes driving point node 103. Voltage $V_{DP}(t)$ is measured between driving point node 103 and ground. Driving point node 103 is located between the output of driver 110 and the input to R(L)C network 120. Current $I_{DP}(t)$ flows from driver 110 to R(L)C network 120.

R(L)C network 120 models an interconnect as an R(L)C network without a DC (Direct Current) connection to ground. R(L)C network 120 includes N interconnect nodes (only one such interconnect node, interconnect node 105(k), is shown in the example of FIG. 1). Capacitance $C_k$ couples interconnect node 105(k) to ground, and voltage $V_k(t)$ is measured across capacitance $C_k$. Each other interconnect node (if any) in R(L)C network 120 is similarly coupled to ground by a respective capacitance across which a respective voltage is measured.

R(L)C network 120 can be obtained by extracting predicted electrical parasitics from the physical layout of an IC design. The model of FIG. 1 is characterized by its voltage transfer function, $Hk(s)=Vk(s)/V0(s)$, and its driving point admittance $Y(s)$, where $Y(s)=I_{DP}(s)/V_{DP}(s)$. The driving point admittance represents the admittance of R(L)C network 120 as seen at driving point node 103. The model of FIG. 1 can be reduced to an Nth order model by matching the first N+1 moments of the driving point admittance $Y(s)$. Such a reduction simplifies delay calculation, while preserving at least some of the accuracy of the representation of the driving point admittance $Y(s)$.

The timing characteristics of cells in an IC design are typically characterized by a lumped capacitive load. However, such characterizations are typically too inaccurate to represent R(L)C network 120. At the same time, using the model of FIG. 1 to perform timing analysis may be undesirable, due the large amount of computation effort needed to analyze the model. To preserve at least some accuracy while reducing the computation effort, the model of FIG. 1 is typically reduced to an equivalent lumped-capacitance interconnect model like the one shown in FIG. 2.

FIG. 2 illustrates a lumped-capacitance interconnect model that is derived from the interconnect model shown in FIG. 1. The lumped-capacitance interconnect model is similar to the interconnect model of FIG. 1, but R(L)C network 120 has been replaced with $C_{\textit{eff}}$. $C_{\textit{eff}}$ is the effective capacitance of R(L)C network 120. Current $I(t)$ flows into $C_{\textit{eff}}$, and voltage $V(t)$ is measured across $C_{\textit{eff}}$.

$C_{\textit{eff}}$ is an "effective" capacitance in that its value is selected so that the average current flowing through $C_{\textit{eff}}$ of FIG. 2 is equal to the average current flowing through driving point node 103 of FIG. 1. The average current (Iavg, shown in the equation below) flowing through $C_{\textit{eff}}$ equals the product of $1/T$ and the integral from $t=0$ to $t=T$ of $I(t)dt$, which in turn equals the product of $1/T$, $C_{\textit{eff}}$, and $V(T)$ (with $V(0)=0$). Time $t=0$ is the time at which ramp voltage $V_0(t)$ stimulus to driver 110 begins ramping up; $t=T$ is the time at which ramp voltage $V_0(t)$ reaches its final value.

$$I_{avg} = \frac{1}{T} \cdot \int_0^T I(t)\,dt = \frac{1}{T} \cdot C_{eff} \cdot V(T)$$

The average current ($I_{DP}$avg, shown in the equation below) through driving point node 103 equals the product of 1/T and the integral from t=0 to t=T of $I_{DP}$(t)dt. This average current in turn equals the product of 1/T and the sum, from k=1 to N, of the product of $C_k$ and $V_k(T)$, with $V_k(0)=0$. N is the total number of interconnect nodes in R(L)C network 120 of FIG. 1.

$$I_{DPavg} = \frac{1}{T} \cdot \int_0^T I_{DP}(t)\,dt = \frac{1}{T} \cdot \sum_{k=1}^{N} C_k \cdot V_k(T)$$

By equating Iavg with $I_{DP}$avg, equation Eq. 1 in FIG. 2 is obtained.

Equation Eq. 1 is used to calculate the value of the effective capacitance, $C_{eff}$, for use in the lumped-capacitance interconnect model, from the characteristics of an interconnect model such as the one shown in FIG. 1. Equation Eq. 1 states that the product of $C_{eff}$ and V(T) is equal to the sum, from k=1 to k=N, of the product of $C_k$ and $V_k(T)$ (as shown in FIG. 1). N is the total number of interconnect nodes in R(L)C network 120 of FIG. 1.

The equation Eq. 1 shown in FIG. 2 requires a numerical solution if N>1 and $V_{DP}(t)$ is not equal to V(t) (i.e., if the driving point voltage in FIG. 1 is not equal to the voltage across the effective capacitance $C_{eff}$ in FIG. 2). V(T) depends on $C_{eff}$ (i.e., $V(T)=f(C_{eff})$). To solve Eq. 1 thus requires the use of numerical methods (e.g., trial and error, Newton-Raphson iteration, and the like). The use of numerical methods can undesirably increase the computation effort needed to calculate the value of $C_{eff}$. For example, faster processors, larger memories, and/or more computation time may be required to solve for $C_{eff}$ than is desirable.

SUMMARY OF THE INVENTION

Various methods and systems for calculating effective capacitance are disclosed. These methods and systems may, in at least some embodiments, provide a closed-form effective capacitance calculation.

In some embodiments, a method involves: accessing data representing an interconnect model, where the interconnect model includes a driving point node and is not a lumped capacitance model; calculating a value of an effective capacitance of the interconnect model to be inversely proportional to a voltage at the driving point node of the interconnect model; and storing the value of the effective capacitance. In some embodiments, the interconnect model is a pi model. In other embodiments, the interconnect model includes one or more inductances. Program instructions implementing such a method can be stored on a computer readable medium.

Calculating the effective capacitance can also involve calculating the effective capacitance to be directly proportional to a sum of one or more products, where each of the products equals a product of a respective one of one or more capacitances included in the interconnect model and a voltage across the respective capacitance. Such a method can also involve accessing data representing a driver model and calculating the value of the effective capacitance as a function of a value (e.g., of a driver resistance $R_{driver}$) included in the driver model.

The foregoing is a summary and thus contains, by necessity, simplifications, generalizations and omissions of detail; consequently, those skilled in the art will appreciate that the summary is illustrative only and is not intended to be in any way limiting. The operations disclosed herein may be implemented in a number of ways, and such changes and modifications may be made without departing from this invention and its broader aspects. Other aspects of the present invention, as defined solely by the claims, will become apparent in the non-limiting detailed description set forth below.

BRIEF DESCRIPTION OF THE DRAWINGS

A more complete understanding of the present invention may be acquired by referring to the following description and the accompanying drawings, in which like reference numbers indicate like features.

FIG. 1 illustrates a generic interconnect model used to perform interconnect delay analysis in VDSM (Very Deep Sub-Micron) IC design processes.

FIG. 2 illustrates a lumped-capacitance interconnect model that is derived from the interconnect model shown in FIG. 1.

FIG. 3 shows an equation that can be used to calculate the effective capacitance of an R(L)C interconnect model, according to one embodiment.

FIG. 5A is a flowchart of a method of calculating effective capacitance, according to one embodiment.

FIG. 5B shows another example of a method of calculating effective capacitance, according to another embodiment.

FIG. 6 shows a series of equations useable to calculate the effective capacitance of a pi model, according to one embodiment.

Figure 4:
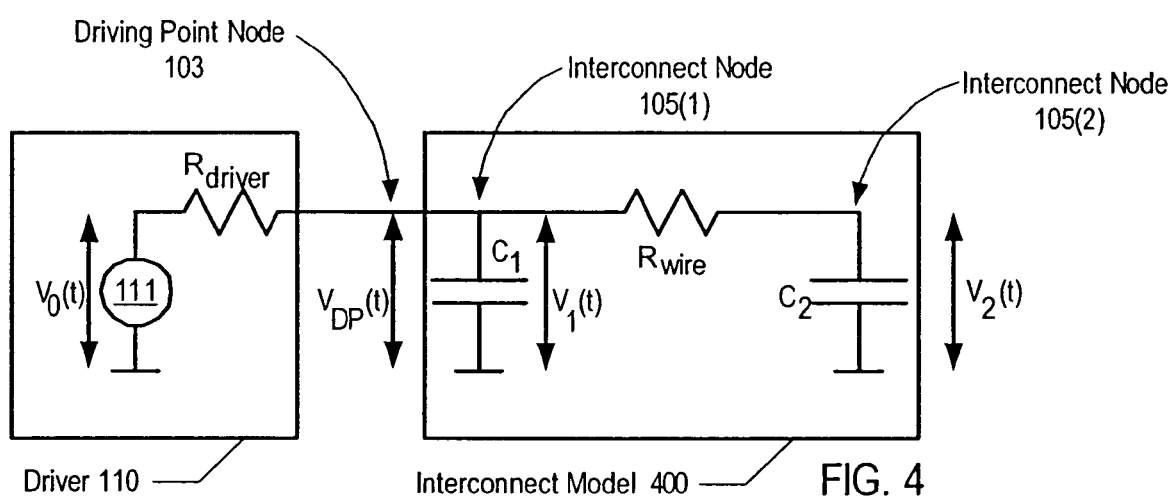
FIG. 4 shows an exemplary pi interconnect load model from which an effective capacitance can be calculated, according to one embodiment.

While the invention is susceptible to various modifications and alternative forms, specific embodiments of the invention are provided as examples in the drawings and detailed description. It should be understood that the drawings and detailed description are not intended to limit the invention to the particular form disclosed. Instead, the intention is to cover all modifications, equivalents and alternatives falling within the spirit and scope of the invention as defined by the appended claims.

DETAILED DESCRIPTION

FIG. 3 illustrates equation Eq. 2, which is usable to calculate the effective capacitance of an interconnect from the nodal capacitances included in an interconnect model, such as the one illustrated in FIG. 1, of the interconnect. Thus, equation Eq. 2 can be used to calculate $C_{eff}$ for use in a lumped capacitance model such as the one illustrated in FIG. 2, from the characteristics of a more complex non-lumped-capacitance interconnect model like that shown in FIG. 1. As shown by Eq. 2, the effective capacitance $C_{\mathit{eff}}$ can be interpreted as a weighted sum of capacitances $C_k$, where the weighting factor is the ratio between the voltage $V_k(T)$ across that capacitance and the voltage $V_{DP}(T)$ at driving point node 103 (as shown in FIG. 1). Thus, $C_{\mathit{eff}}$ is proportional to the sum of the products of each nodal capacitance $C_k$ multiplied by its respective nodal voltage, at time t=T, $V_k(T)$, and $C_{\mathit{eff}}$ is inversely proportional to $V_{DP}(T)$. Voltage $V_k(T)$ is voltage $V_k(t)$, as shown in FIG. 1, at time t=T, and voltage $V_{DP}(T)$ is voltage $V_{DP}(t)$ at time t=0 (as mentioned above, time t=0 is the time at which ramp voltage $V_0(t)$ stimulus to driver 110 begins ramping up; t=T is the time at which ramp voltage $V_0(t)$ reaches its final value).

Equation Eq. 2 provides a closed-form solution for at least some interconnect models, since all of the voltages $V_k(T)$ can be precalculated for a given R(L)C network if N is less than or equal to 2 and since $V_{DP}(T)$ is not a function of $C_{\mathit{eff}}$. For certain interconnect models, $C_{\mathit{eff}}$ can be calculated from the equation of FIG. 3 using analytic (as opposed to numerical) techniques. Analytical techniques are typically much less complex and computationally intensive than numerical techniques.

It is noted that $V_{DP}(T)$ of equation Eq. 2 differs from V(T) of equation Eq. 1 in several ways. V(T) is the voltage across the effective capacitance $C_{\mathit{eff}}$ in a lumped capacitance model. V(T) is thus dependent on $C_{\mathit{eff}}$ and cannot be calculated independently of $C_{\mathit{eff}}$ using traditional techniques. In contrast, $V_{DP}(T)$ is the driving point voltage across the input to a non-lumped-capacitance interconnect model that includes an R(L)C network. $V_{DP}(T)$ does not depend on $C_{\mathit{eff}}$ (which is not part of the R(L)C network modeled by a non-lumped-capacitance interconnect model), and thus, unlike V(T), $V_{DP}(T)$ can be calculated independently of $C_{\mathit{eff}}$.

Figure 8:
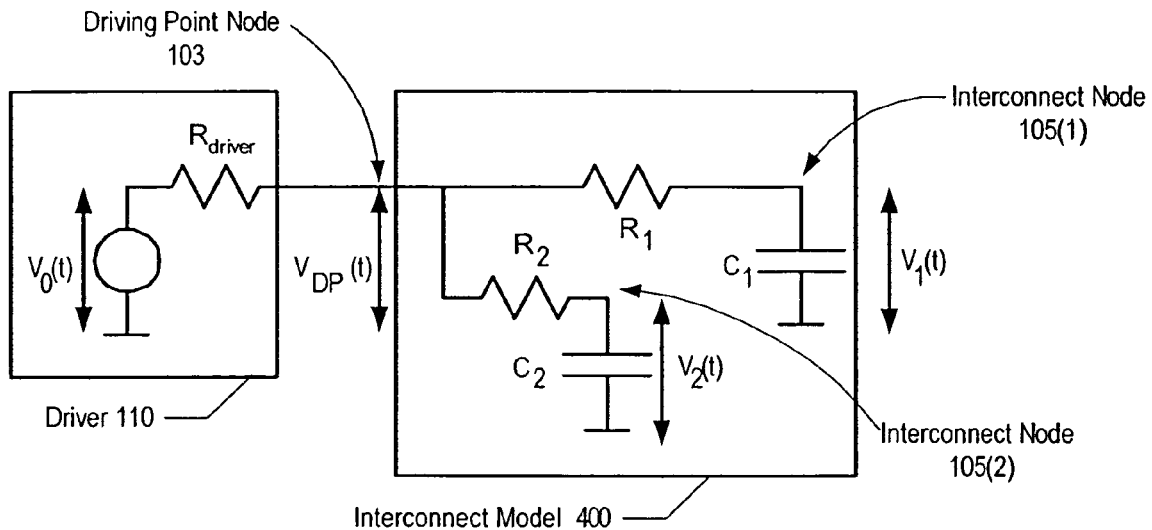
FIG. 8 illustrates another interconnect model from which an effective capacitance can be calculated, according to one embodiment.
Figure 9:
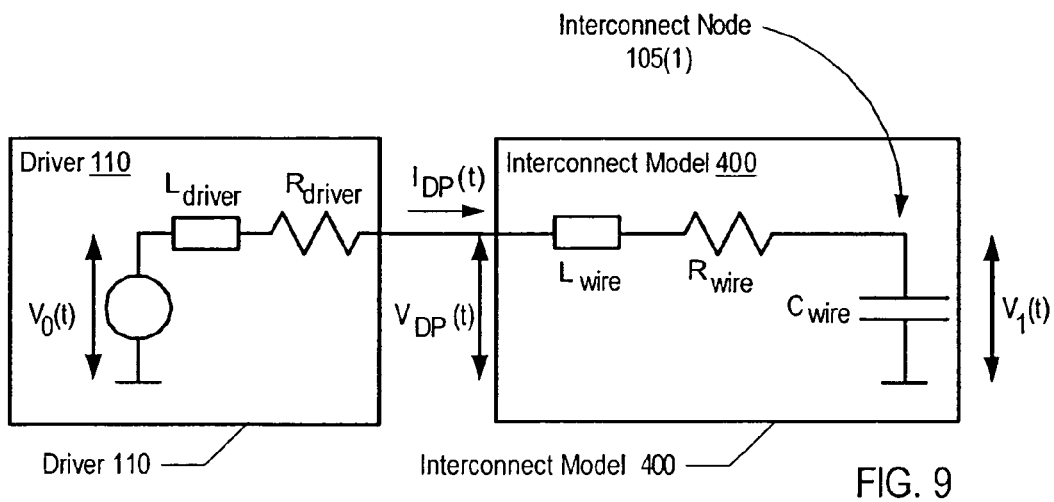
FIG. 9 illustrates yet another interconnect model from which effective capacitance can be calculated, according to one embodiment.

The equation Eq. 2 of FIG. 3 can be used with various different interconnect models that include one or more nodal capacitances coupled to ground. Exemplary interconnect models from which equation Eq. 2 can calculate an effective capacitance are shown in FIGS. 4 and 8-9.

FIG. 4 shows an exemplary pi interconnect load model from which an effective capacitance can be calculated using equation Eq. 2 of FIG. 3. In this example, driver 110 is coupled to interconnect model 400. Driver 110 is represented by a voltage source 111, across which a voltage $V_0(t)$ is applied, and a resistance $R_{\mathit{driver}}$.

In this example, interconnect model 400 is a pi model that includes capacitance $C_1$, capacitance $C_2$, and resistor $R_{\mathit{wire}}$. $R_{\mathit{wire}}$ couples $C_1$ and $C_2$. The interconnect model 400 includes two interconnect nodes 105(1) and 105(2). Driving point node 103 is at the same electrical potential as interconnect node 105(1), and thus the voltage $V_{DP}(t)$ measured between the driving point node and ground is the same as the voltage $V_1(t)$ measured across $C_1$.

Equation Eq. 2 of FIG. 3 can be used to calculate the effective capacitance $C_{\mathit{eff}}$ of interconnect model 400. In the example of FIG. 4, the effective capacitance Ceff=$C_1 * V_1(t)/V_{DP}(t) + C_2 * V_2(t)/V_{DP}(t)$. Since $V_1(t)=V_{DP}(t)$, this equation reduces to $C_{\mathit{eff}}=C_1+C_2 * V_2(t)/V_{DP}(t)$. Additional details regarding the calculation of $V_{DP}(t)$ and $V_2(t)$ are provided below with respect to FIGS. 6-7.

FIG. 5A illustrates a method of calculating the effective capacitance of an interconnect model. At 501, stored values indicative of each capacitance, resistance, and/or inductance in the interconnect model and/or driver model from which the effective capacitance is being calculated are accessed. For example, if the interconnect model from which the effective capacitance is to be calculated is a pi model like that shown in FIG. 4, values representing nodal capacitances $C_1$ and $C_2$ (from the pi model) and resistances $R_{\mathit{wire}}$ (from the pi model) and $R_{\mathit{driver}}$ (from the driver model) are accessed. These values can be accessed from a stored interconnect model representing an interconnect in an IC design and a stored driver model representing a gate in the IC design.

At 503, the values accessed at 501 are used to calculate the voltage at each node in the interconnect model (each node is a point coupled to ground by a respective one of the capacitances in the interconnect model, and thus the voltage at each node is the voltage across a respective capacitance) and the voltage at the driving point node of the interconnect model. For example, if the interconnect model is the pi model shown in FIG. 4, the values of $R_{\mathit{wire}}$, $R_{\mathit{driver}}$, $C_1$, and $C_2$ can be processed to obtain values representing the voltage at interconnect nodes 105(1) and 105(2) as well as the voltage at the driving point node 103 (in this example the voltage at the driving point node 103 is the same as the voltage at the first interconnect node 105(1)).

The effective capacitance is calculated to be inversely proportional to the voltage at the driving point node and proportional to the sum of the products formed by multiplying each one of the capacitances by the voltage across that capacitance, as indicated at 505. At 507, a value indicative of the effective capacitance generated at 505 is stored. This value may then be used to perform timing analysis of an IC design in which the interconnect represented by the interconnect model is included.

It is noted that, in at least some embodiments, the computation that calculates the effective capacitance (e.g., in function 505) and the computation(s) to calculate the voltage across each capacitance and the voltage at the driving point node (e.g., in function 503) can be substantially combined. For example, the values of the capacitances, resistances, and/or inductances in the interconnect model can be accessed as input parameters to a process that calculates the effective capacitance. Such a process may perform computations according to Eq. 2 of FIG. 3, into which expressions representing the individual voltages $V_k$ and $V_{DP}$ have been substituted. Thus, the voltages $V_k$ and $V_{DP}$ may be calculated as part of the process of calculating $C_{\mathit{eff}}$. Execution of such a process may not necessarily store the values of these voltages in such a way that they are accessible to external processes. Furthermore, in some embodiments, these voltages are not independently calculated at all. For example, a process that calculates effective capacitance can operate according to a formula that, due to algebraic reductions after the expressions for the individual voltages have been substituted into Eq. 2, does not actually calculate each of the individual voltages across the capacitances and/or the voltage at the driving point node (e.g., the process may operate on the input parameters according to an equation such as Eq. 9 of FIG. 6). In such embodiments, function 503 is not performed. However, the effective capacitance calculated by such processes is still calculated in such a way that the effective capacitance is inversely proportional to the voltage at the driving point node and directly proportional the sum of the products formed by multiplying each one of the capacitances by the voltage across that capacitance.

FIG. 5B illustrates another method of calculating the effective capacitance of an interconnect model. As in the method of FIG. 5A, this method involves accessing values indicative of each capacitance, resistance, and/or inductance in the interconnect model and/or driver model, as shown at 551. These values can then be used to calculate the voltage at the driving point node of the interconnect model and the voltages across each of the capacitances, as indicated at 553.

At 555, each capacitance (accessed at 501) is scaled by ratio of the voltage across that capacitance to voltage at the driving point node. The scaled capacitances are summed to produce effective capacitance, as indicated at 557. As with functions 503-505 of FIG. 5A, functions 553-557 of FIG. 5B can be combined in some embodiments. At 559, a value indicative of the effective capacitance generated at 557 is stored.

It is noted that functions 555-557 of FIG. 5B operate to calculate the effective capacitance in a fashion that is consistent with function 505 of FIG. 5A. In other words, the effective capacitance generated by function 557 of FIG. 5B is inversely proportional to the voltage at the driving point node and directly proportional the sum of the products formed by multiplying each one of the capacitances by the voltage across that capacitance. Other methods can also calculate the effective capacitance in a way that is consistent with function 505 of FIG. 5A. For example, the effective capacitance can be calculated by summing the products formed by multiplying each one of the capacitances in the interconnect model by the voltage across that capacitance, and then dividing the sum by the voltage at the driving point node. Alternatively, the effective capacitance can be calculated by calculating the products formed by multiplying each one of the capacitances in the interconnect model by the voltage across that capacitance, dividing each of those products by the voltage at the driving point node, and then summing each of the modified products.

FIG. 6 shows equations that can be used to calculate the effective capacitance of the pi interconnect model shown in FIG. 4. Eqs. 3 calculate three time constants, $T_{11}$, $T_{12}$, and $T_{22}$ from the values of the capacitances and resistances in the pi interconnect model and the driver model (these capacitances and resistances are examples of the values accessed in function 501 of FIG. 5A). Eqs. 4 calculate additional time constants, $T_{Root}$ and $T_{Elmore}$, from the time constants generated by Eqs. 3. Eqs. 5 calculate constants $s_1$ and $s_2$ from the time constants generated by Eqs. 3 and 4. Constants $s_1$, and $s_2$ are then used, in conjunction with $T_{22\ and\ TRoot}$, to generate constants $\tau^1_1, \tau^1_2, \tau^2_1$, and $\tau^2_2$, as shown by Eqs. 6. Equations Eq. 7 show the time domain responses of $V_1(t)$ and $V_2(t)$ of the pi model in response to a ramp voltage $V_0(t)$ at the driver ($V_0(t)$, $V_1(t)$, and $V_2(t)$ are shown in FIG. 4). Eqs. 3-6 are examples of equations that can be used to calculate the voltages in function 503 in FIG. 5A.

Eq. 8 shows the effective capacitance equation Eq. 2 of FIG. 3 into which the specific parameters of the pi model have been input. Since there are two capacitances in the pi model, N=2. Since $V_{DP}=V_1$, the first term of equation Eq. 8 is $C_1$ (which equals $C_1*V_1(T)/V_{DP}(T)$). For the same reason, the second term of equation Eq. 8 is $C_2/V_1(T)$.

Expressions for $V_1(T)$ and $V_2(T)$ are obtained by setting t=T in equations Eqs. 7. These expressions are combined with Eq. 8 to produce Eq. 9. Using Eq. 9, the effective capacitance of the pi model can be calculated directly from the values $R_{wire}$, $R_{driver}$, $C_1$, and $C_2$ (Eq. 9 provides a way to combine functions 503 and 505 of FIG. 5A). Thus, the example equations of FIG. 6 show how the use of Eq. 2 in FIG. 3 can provide a closed-form solution for calculating effective capacitance of a pi model.

Figure 7:
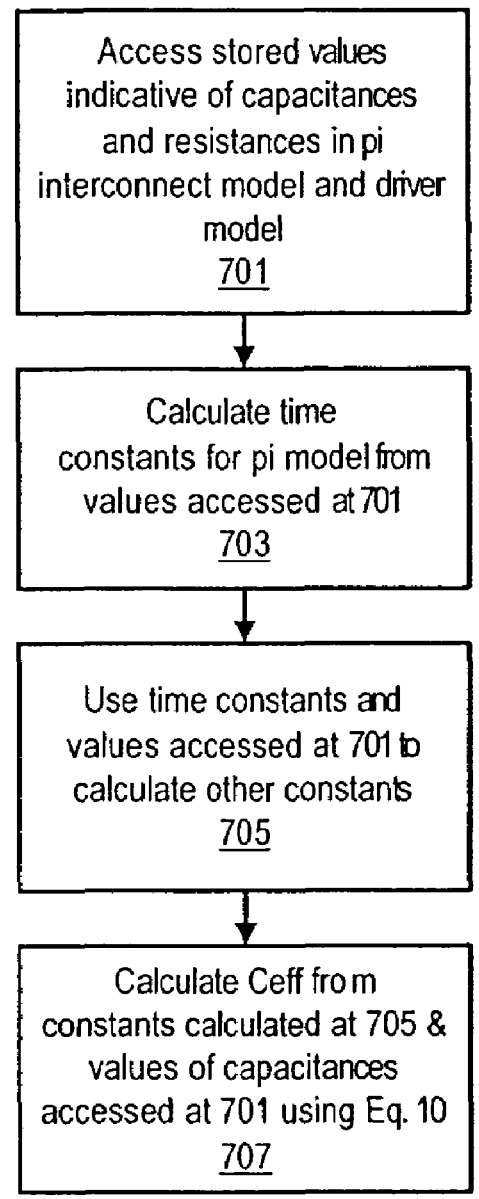
FIG. 7 is a flowchart of a method of calculating the effective capacitance of a pi model, according to one embodiment.

FIG. 7 shows how effective capacitance can be calculated for a pi model. At 701, stored values indicative of capacitances and resistances in a pi interconnect model are accessed. Time constants (e.g., $T_{11}$, $T_{12}$, and $T_{22}$ from FIG. 6) for the pi model are calculated from the values accessed at 701, as shown at 703. At 705, the time constants calculated at 703 and the values accessed at 701 are used to calculate other constants (e.g., $s_1$, $s_2$, $T_{Root}$, $T_{Elmore}$, $\tau^1_1, \tau^1_2, \tau^2_1$, and $\tau^2_2$). $C_{eff}$ is then calculated from the constants calculated at 705 & the values of capacitances accessed at 701, using Eq. 9 of FIG. 6.

FIG. 8 illustrates another example of an interconnect load model 400 for which effective capacitance can be calculated using the equation of FIG. 3. This model can represent a multi-fanout net with unbalanced loads on several branches. This model can also represent an interconnect that is experiencing coupling (i.e., non-grounded capacitance), since $R_1$ and $R_2$ of FIG. 8 can each represent, partially or totally, the holding resistances of the coupled nets.

In this example, interconnect model 400 is represented by a model that has two parallel branches. Each branch includes a resistance in series with a capacitance that is coupled to ground. The first branch includes resistance $R_1$ and capacitance $C_1$. Interconnect node 105(1) is located at the point where resistance $R_1$ is coupled to capacitance $C_1$. Capacitance $C_1$ couples interconnect node 105(1) to ground. The second branch includes resistance $R_2$ and capacitance $C_2$. Interconnect node 105(2) is located between capacitance $C_2$ and resistance $R_2$. Capacitance $C_2$ couples interconnect node 105(2) to ground. Note that in other embodiments, interconnect load model 400 can include more branches than are illustrated in FIG. 8.

In FIG. 8, voltage $V_1(t)$ at interconnect node 105(1) is the voltage across capacitance $C_1$. Voltage $V_2(t)$ at interconnect node 105(2) is similarly the voltage across capacitance $C_2$. Unlike the example of FIG. 4, driving point voltage $V_{DP}(t)$ of this interconnect model is not the same as one of the voltages $V_1(t)$ or $V_2(t)$ across one of the capacitances. Using equation Eq. 2, the effective capacitance of interconnect load 400 can be expressed as $C_{eff}=C_1*V_1(T)/V_{DP}(T)+C_2*V_2(T)/V_{DP}(T)$. Values of $V_1(T)$, $V_{DP}(T)$, and $V_2(T)$ can be obtained using typical circuit analysis techniques and calculated from the values of $R_{driver}$, $R_1$, $R_2$, $C_1$, and $C_2$.

FIG. 9 illustrates another interconnect model for which effective capacitance can be calculated using equation Eq. 2 of FIG. 3. In this example, both driver model 110 and interconnect model 400 include an inductance. Driver model 110 includes inductance $L_{driver}$, and interconnect model 400 includes inductance $L_{wire}$. The driver model 110 and interconnect model 400 of this example can be useful, for example, when calculating delay for circuitry designed to be operated above 500 MHz.

In addition to inductance $L_{wire}$, interconnect model 400 includes resistance $R_{wire}$ and capacitance $C_{wire}$. $L_{wire}$, $R_{wire}$, and $C_{wire}$ are arranged in series. $C_{wire}$ is coupled between $R_{wire}$ and ground. Interconnect node 105(1) is located between $C_{wire}$ and $R_{wire}$. Voltage $V_1(t)$ at interconnect node 105(1) is the voltage across $C_{wire}$.

Using equation Eq. 2 of FIG. 3, the effective capacitance $C_{eff}$ of the interconnect load model 400 is $C_{wire}*V_1(T)/V_{DP}(T)$. $V_1(T)$ and $I_{DP}(T)$ can be analytically calculated in response to $V_0$ from values of $L_{driver}$, $L_{wire}$, $R_{driver}$, and $R_{wire}$. As part of this calculation, the inductances $L_{driver}$ and $L_{wire}$ can be lumped together, as may be the resistances $R_{driver}$ and $R_{wire}$. $V_{DP}(T)$ can be calculated from $V_1(T)$ and $I_{DP}(T)$ using Ohm's law.

Figure 10:
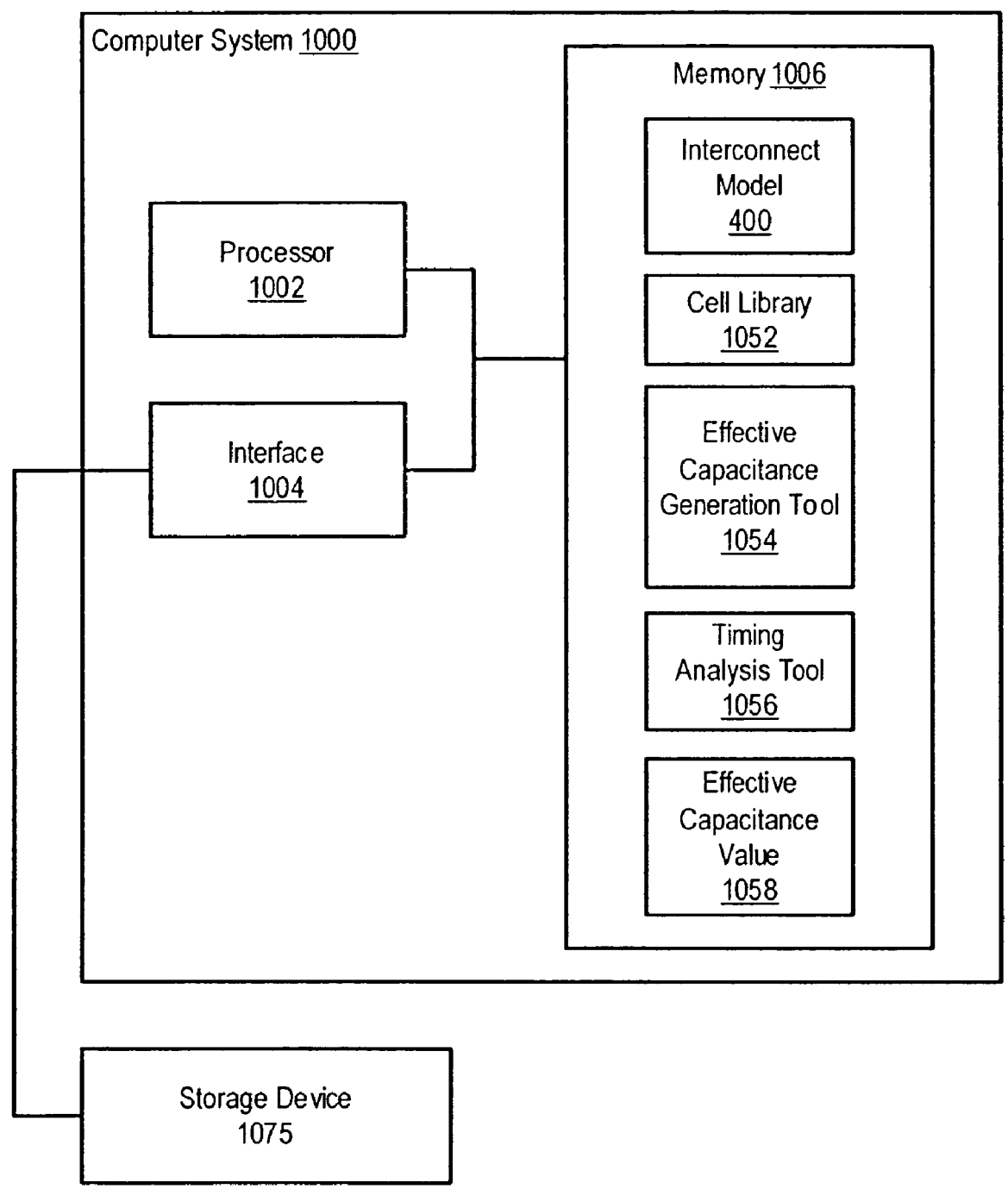
FIG. 10 illustrates a computer system that runs software configured to calculate effective capacitance, according to one embodiment.

FIG. 10 shows a block diagram of a computer system 1000 that includes software configured to calculate effective capacitance from an interconnect model 400, according to one embodiment. As illustrated, computer system 1000 includes one or more processors 1002, I/O interface 1004 (e.g., a bus bridge, network interface card, or other device for interfacing to other computers or to peripheral devices), and memory 1006. Memory 1006 stores data and instructions, executable by processor 1002, that implement interconnect model 400, cell library 1052, effective capacitance generation tool 1054, and timing analysis tool 1056. The instructions and data stored in memory 1006 can be organized into one or more data and/or program files.

I/O interface 1004 is coupled to a storage device 1075. Storage device 1075 can be coupled to computer system 1000 by a bus, network (e.g., the Internet), or other interconnect. Storage device 1075 provides a persistent store for information accessed by computer system 1000 and can be implemented using magnetic, optical and/or mechanical (e.g., MEMS (Micro Electro-Mechanical Systems) memory. Storage device 1075 can include a single storage device or an array of storage devices.

Interconnect model 400 is an R(L)C model of an interconnect model included in an IC design. Interconnect model 400 can be obtained in response to extracting information indicative of the predicted characteristics of an interconnect from the physical layout of the IC design. Interconnect model 400 can be any of various types of R(L)C networks. For example, interconnect model 400 can be a pi model (e.g., as shown in FIG. 4), a multi-fanout net with unbalanced loads (e.g., as shown in FIG. 8), an interconnect model that includes inductance (e.g., as shown in FIG. 9), or any other appropriate interconnect model that includes one or more capacitances coupled to ground.

Cell library 1052 includes various standard components and precalculated information useable to model and simulate the performance and functionality of components included in an IC design. In particular, cell library 1052 includes information representing various cells (e.g., logic gates and other components) included in the IC design. Cell library 1052 can include, for example, a driver model for each cell. The driver model for a cell coupled to the interconnect modeled by interconnect model 400 can be used in conjunction with the interconnect model 400 to calculate the effective capacitance of the interconnect model. For example, parameters such as $R_{driver}$ and/or $L_{driver}$ can be obtained from the driver model for the cell.

Effective capacitance generation tool 1054 is a process that is configured to generate the effective capacitance, for use in a lumped-capacitance model, of an interconnect modeled by interconnect model 400. Effective capacitance generation tool 1054 generates the effective capacitance according to Eq. 2 of FIG. 3. Effective capacitance generation tool 1054 uses information included in interconnect model 400 and cell library 1052 (e.g., such as information about the driver coupled to that interconnect) to calculate effective capacitance. Effective capacitance generation tool 1054 stores the calculated effective capacitance as effective capacitance value 1058.

In some embodiments, effective capacitance generation tool 1054 calculates values of effective capacitance for several different values of each parameter in a given type interconnect model. For example, if the type of interconnect model being considered is a pi model, effective capacitance generation tool 1054 can calculate values of effective capacitance for each of several values of each parameter ($C_1$, $R_{driver}$, $R_{wire}$, and $C_2$) in the pi model. The different effective capacitance values can be stored in a lookup table and indexed by the values of the parameters used to generate each different effective capacitance value. By precharacterizing the type of interconnect model according to a lookup table, the value of the effective capacitance for a given instance of that type of interconnect model can be calculated by interpolating between values in the lookup table based on the relationship between the actual parameters of that instance of the interconnect model and the values of the parameters used to index into the lookup table. Thus, in some embodiments, effective capacitance value 1058 may be one of several effective capacitance values included in a lookup table.

Timing analysis tool 1056 is configured to perform timing analysis of a substantially complete IC design. Timing analysis tool 1056 uses the effective capacitance value 1058 to calculate, for example, the driving point admittance of a lumped-capacitance model derived from interconnect model 400. The driving point admittance can then be used to analyze the timing of the IC design that includes the interconnect modeled by interconnect model 400.

If effective capacitance generation tool 1054 has precalculated a lookup table of different effective capacitance values, timing analysis tool 1056 can access the lookup table, based on the specific values of one or more parameters of interconnect model 400, and interpolate between values in the lookup table to obtain the effective capacitance.

It is noted that, in at least some embodiments, the tools and data illustrated as being stored in memory 1006 in FIG. 10 can be distributed across computer systems and storage devices linked by one or more networks. For example, cell library 1052 may be stored in a storage device coupled to computer system 1000 by a LAN (Local Area Network) or SAN (Storage Area Network). Portions of cell library 1052 can be loaded into memory 1006 of a particular computer system as different parts of the IC design are analyzed by applications such as effective capacitance generation tool 1054 and/or timing analysis tool 1056 executing on that computer system.

Different applications can execute on different computer systems and exchange results via a network. For example, effective capacitance generation tool 1054 can be configured to calculate one or more effective capacitance values for a given instance of an interconnect model and/or for a given type of interconnect model and to store the effective value(s) (e.g., as part of a lookup table) to a network storage device 1075. This stored information can then be accessed by timing analysis tool 1056, which is executing on a different computer system than effective capacitance generation tool 1054.

The tools illustrated as being separate applications in FIG. 10 can also be implemented as a single application in some embodiments. For example, functionality implemented by effective capacitance generation tool 1054 can be integrated into a single application with timing analysis tool 1056.

The program instructions and data implementing interconnect model 400, cell library 1052, effective capacitance generation tool 1054, and/or timing analysis tool 1056 can be stored upon various computer readable media such as memory 1006. In some embodiments, software implementing at least some of these tools is stored on a computer readable medium such as a CD (Compact Disc), DVD (Digital Versatile Disc), hard disk, optical disk, tape device, floppy disk, and the like). In order be executed by processor 1002, the instructions and data implementing the tools and/or models are loaded into memory 1006 from the other computer readable medium. In some embodiments, a computer readable medium is a carrier medium such as a network and/or a wireless link upon which signals such as electrical, electromagnetic, or digital signals, on which the data and instructions implementing the tools and/or models are encoded, are conveyed.

Although the present invention has been described with respect to a specific embodiment thereof, various changes and modifications may be suggested to one skilled in the art. It is intended that such changes and modifications fall within the scope of the appended claims.

What is claimed is:

1. A method, comprising:

accessing data representing an interconnect model, wherein the interconnect model includes a driving point node;

reducing the interconnect model to a lumped capacitance model consisting of an effective capacitance, wherein said reducing comprises:

calculating the effective capacitance by setting a voltage across the effective capacitance equal to a voltage at the driving point node of the interconnect model; and storing a value representing the effective capacitance.

2. The method of claim 1, wherein said calculating the effective capacitance comprises:

scaling one or more capacitances, included in the interconnect model, by a ratio of a voltage across the one or more capacitances to the voltage at the driving point node.

3. The method of claim 2, wherein the scaling the one or more capacitances comprises:

scaling a first capacitance included in the interconnect model by a ratio of a voltage across the first capacitance to the voltage at the driving point node, wherein the scaling the first capacitance produces a first scaled capacitance;

scaling a second capacitance included in the interconnect model by a ratio of a voltage across the second capacitance to the voltage at the driving point node, wherein the scaling the second capacitance produces a second scaled capacitance; and the calculating the effective capacitance comprises:

summing the first scaled capacitance and the second scaled capacitance to produce an effective capacitance value.

4. The method of claim 3, further comprising:

calculating a plurality of time constants from the first capacitance and the second capacitance; and using the plurality of time constants to perform said scaling the first capacitance, said scaling the second capacitance, and said summing.

5. The method of claim 2, wherein the scaling the one or more capacitances comprises:

multiplying each one of the one or more capacitances by a respective voltage across that one of the one or more capacitances to generate a respective one of one or more first products; and dividing each one of the one or more first products by the voltage at the driving point node to produce a respective one of one or more second products; and the calculating the effective capacitance comprises summing the one or more second products to produce an effective capacitance value.

6. The method of claim 2, wherein the scaling the one or more capacitances comprises:

multiplying each one of the one or more capacitances by a respective voltage across that one of the one or more capacitances to generate a respective one of one or more first products;

summing the one or more first products to produce a first value; and dividing the first value by the voltage at the driving point node to produce an effective capacitance value.

* * * * *